United States Patent
Cho

(10) Patent No.: US 6,967,755 B2
(45) Date of Patent: Nov. 22, 2005

(54) HOLOGRAPHIC ROM SYSTEM INCLUDING AN ALIGNMENT APPARATUS FOR ALIGNING A HOLOGRAPHIC MEDIUM AND A MASK

(75) Inventor: Jang-Hyun Cho, Seoul (KR)

(73) Assignee: Daewoo Electronics Corporation, Seoul (KR)

( * ) Notice: Subject to any disclaimer, the term of this patent is extended or adjusted under 35 U.S.C. 154(b) by 0 days.

(21) Appl. No.: 10/860,320

(22) Filed: Jun. 4, 2004

(65) Prior Publication Data

US 2004/0263925 A1    Dec. 30, 2004

(30) Foreign Application Priority Data

Jun. 30, 2003  (KR) ................. 10-2003-0043151

(51) Int. Cl.[7] .............................................. G02B 26/10
(52) U.S. Cl. .............................. 359/15; 359/1; 359/34; 355/2; 356/400
(58) Field of Search .............................. 359/1, 12, 15, 359/18, 34; 355/2, 67; 356/400

(56) References Cited

U.S. PATENT DOCUMENTS

| | | | |
|---|---|---|---|
| 2004/0263815 A1 * | 12/2004 | Kim | 355/67 |
| 2005/0018263 A1 * | 1/2005 | Pharris | 359/22 |
| 2005/0036182 A1 * | 2/2005 | Curtis et al. | 359/15 |

\* cited by examiner

*Primary Examiner*—Fayez G. Assaf
(74) *Attorney, Agent, or Firm*—Bacon & Thomas PLLC

(57) ABSTRACT

A holographic ROM system includes an alignment apparatus for aligning a holographic medium for storing data and a mask with patterns of the data. The alignment apparatus has a beam irradiating unit for irradiating a light beam to alignment marks of the holographic medium and the mask; an alignment mechanism for moving at least one of the holographic medium and the mask in response to a control signal; a photo detecting unit for detecting the beam passing through the alignment marks of the holographic medium and the mask while the holographic medium and/or the mask being moved; and a control unit for generating the control signal, the control unit controlling the alignment mechanism based on intensity of the beam detected by the photo detecting unit.

7 Claims, 5 Drawing Sheets

HOLOGRAPHIC ROM SYSTEM INCLUDING AN ALIGNMENT APPARATUS FOR ALIGNING A HOLOGRAPHIC MEDIUM AND A MASK

FIELD OF THE INVENTION

The present invention relates to a holographic ROM (read-only memory) system; and, more particularly, to a holographic ROM system including an alignment apparatus capable of automatically and precisely aligning a holographic medium for storing data and a mask with patterns of the data.

BACKGROUND OF THE INVENTION

Holographic memory systems normally employ a page-oriented storage approach. An input device such as a SLM (spatial light modulator) presents recording data in the form of a two dimensional array (referred to as a page), while a detector array such as a CCD camera is used to retrieve the recorded data page upon readout. Other architectures have also been proposed wherein a bit-by-bit recording is employed in lieu of the page-oriented approach. All of these systems, however, suffer from a common drawback in that they require the recording of a huge number of separate holograms in order to fill the memory to capacity. A typical page-oriented system using a megabit-sized array would require the recording of hundreds of thousands of hologram pages to reach the capacity of 100 GB or more. Even with the hologram exposure times of millisecond-order, the total recording time required for filling a 100 GB-order memory may easily amount to at least several tens of minutes, if not hours. Thus, another holographic ROM system such as shown in FIG. 5 has been developed, where the time required to produce a 100 GB-order capacity disc may be reduced to under a minute, and potentially to the order of seconds.

The holographic ROM system in FIG. 5 includes a light source 1, HWPs (half wave plates) 2, 12, an expanding unit 4, a PBS (polarizer beam splitter) 6, polarizers 8, 14, mirrors 10, 16, a mask 22, a holographic medium 20, and a conical mirror 18.

The light source 1 emits a laser beam with a constant wavelength, e.g., a wavelength of 532 nm. The laser beam, which is of only one type of linear polarization, e.g., P-polarization or S-polarization, is provided to the HWP 2. The HWP 2 rotates the polarization of the laser beam by θ degree (preferably 45°). And then, the polarization-rotated laser beam is fed to the expanding unit 4 for expanding the beam size of the laser beam up to a predetermined size. Thereafter, the expanded laser beam is provided to the PBS 6.

The PBS 6, which is manufactured by repeatedly depositing at least two kinds of materials each having a different refractive index, serves to transmit one type of polarized laser beam, e.g., P-polarized beam, and reflect the other type of polarized laser beam, e.g., S-polarized beam. Thus the PBS 6 divides the expanded laser beam into a transmitted laser beam (hereinafter, a signal beam) and a reflected laser beam (hereinafter, a reference beam) having different polarizations, respectively.

The signal beam, e.g., of a P-polarization, is fed to the polarizer 8, which removes imperfectly polarized components of the signal beam and allows only the purely P-polarized component thereof to be transmitted therethrough. And then the signal beam with perfect or purified polarization is reflected by the mirror 10. Thereafter, the reflected signal beam is projected onto the holographic medium 20 via the mask 22. The mask 22, presenting data patterns for recording, functions as an input device, e.g., a spatial light modulator (SLM).

On the other hand, the reference beam is fed to the HWP 12. The HWP 12 converts the polarization of the reference beam such that the polarization of the reference beam becomes identical to that of the signal beam. And then the reference beam with converted polarization is provided to the polarizer 14, wherein the polarization of the reference beam is more purified. And the reference beam with perfect polarization is reflected by the mirror 16. Thereafter, the reflected reference beam is projected onto the conical mirror 18 (the conical mirror 18 being of a circular cone having a circular base with a preset base angle between the circular base and the cone), which is fixed by a holder (not shown). The reflected reference beam is reflected toward the holographic medium 20 by the conical mirror 18. The incident angle of the reflected reference beam on the holographic medium 20 is determined by the base angle of the conical mirror 18.

The holder for fixing the conical mirror 18 should be installed on the bottom side of the conical mirror 18, in order to prevent the reference beam from being blocked by the holder. Since the holder should be placed on the bottom side of the conical mirror 18, it is usually installed through a center opening 24 of the holographic medium 20.

The holographic medium 20 is a disk-shaped material for recording the data patterns. The mask 22 provides the data patterns to be stored in the holographic medium 20. By illuminating the mask 22 with a normally incident plane wave, i.e., the signal beam, and by using the reference beam incident from the opposite side to record holograms in the reflection geometry, the diffracted pattern is recorded in the holographic medium 20. A conical beam shape is chosen to approximate the plane wave reference beam with a constant radial angle at all positions on the disc, such that the hologram can be read locally by a fixed-angle narrow plane wave while the disc is rotating during playback. Furthermore, an angular multiplexing can be realized by using the conical mirror 18 with a different base angle (see "Holographic ROM system for high-speed replication", 2002 IEEE, by Ernest Chuang, et al.).

By using the above-mentioned scheme, the time required to produce a fully recorded 100 GB-order capacity disc may be reduced to less than a minute, and potentially to an order of seconds.

Meanwhile, in order to record holographic data in the holographic medium 20 (hereinafter, also referred to as "disk"), it is required to precisely align the mask with the disk. In a conventional method of aligning the disk and the mask, an operator directly observes alignment marks formed thereon by using a high multiple microscope and an illuminating device.

However, in such a conventional method, the productivity of the holographic ROM system is decreased since the operator should align the disk and the mask while directly observing the alignment marks thereof with his/her eyes through the microscope. Further, if the operator is not a skilled person, there is high likelihood of a misalignment of the disk and the mask.

SUMMARY OF THE INVENTION

It is, therefore, an object of the present invention to provide a holographic ROM system including an alignment apparatus for aligning a holographic medium for storing therein data and a mask with patterns of the data, and a method for aligning the holographic medium and the mask, wherein the holographic medium and the mask are automatically and precisely aligned.

In accordance with an aspect of the present invention, there is provided a holographic ROM system including: an alignment apparatus for aligning a holographic medium for storing data and a mask with patterns of the data, the alignment apparatus having a beam irradiating unit for irradiating a light beam to alignment marks of the holographic medium and the mask; an alignment mechanism for moving at least one of the holographic medium and the mask in response to a control signal; a photo detecting unit for detecting the beam passing through the alignment marks of the holographic medium and the mask while the holographic medium and/or the mask being moved; and a control unit for generating the control signal, the control unit controlling the alignment mechanism based on intensity of the beam detected by the photo detecting unit.

In accordance with another aspect of the present invention, there is provided a method for aligning a holographic medium for storing data and a mask with patterns of the data in a holographic ROM system, the method comprising the steps of: irradiating a light beam to alignment marks of the holographic medium and the mask while moving the holographic medium and the mask; detecting intensity of the beam passing through the alignment marks of the holographic medium and the mask; and locating the holographic medium and the mask based on the intensity of the beam detected.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
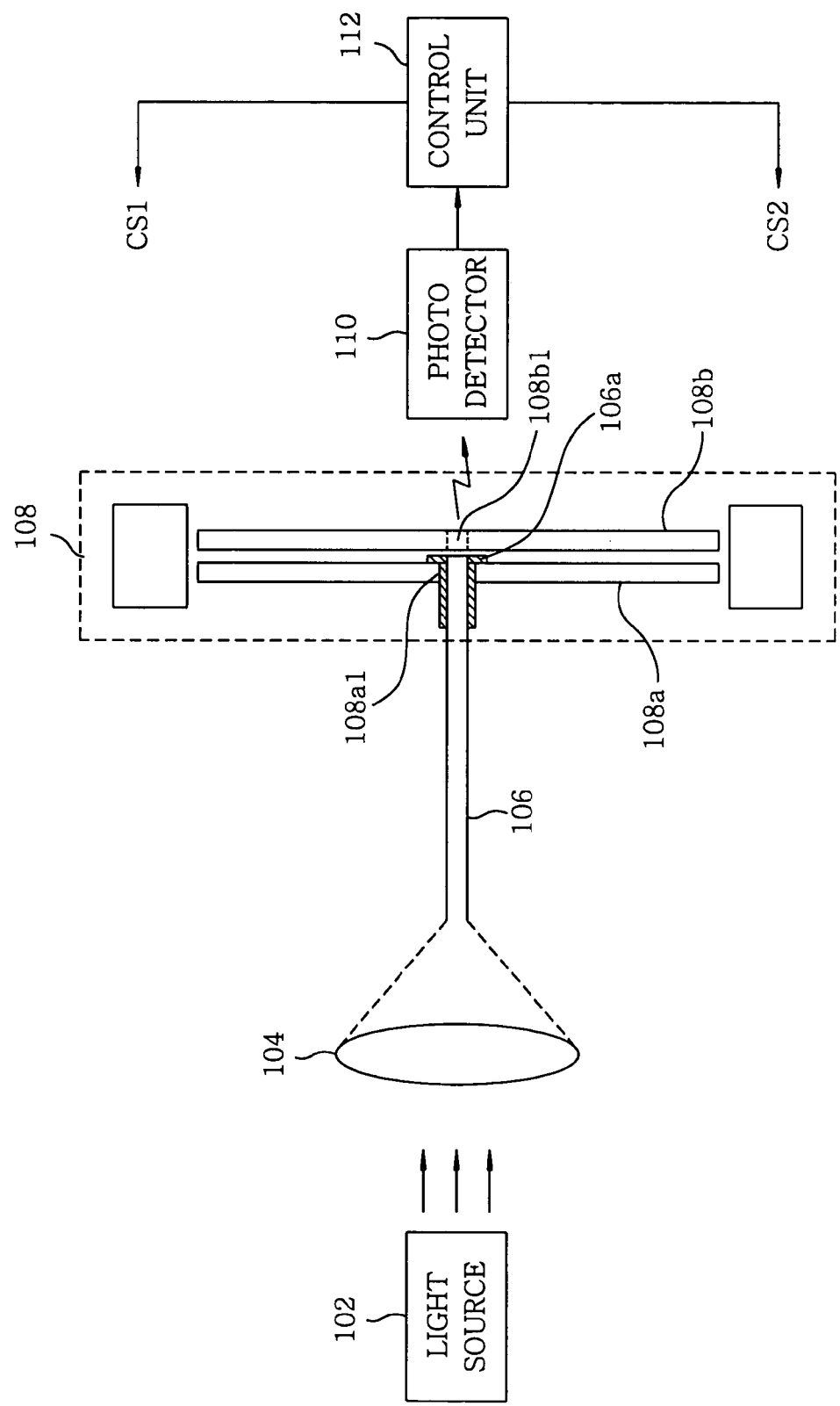
FIG. 1 shows a schematic diagram of an alignment apparatus in accordance with a preferred embodiment of the present invention.
Figure 5:
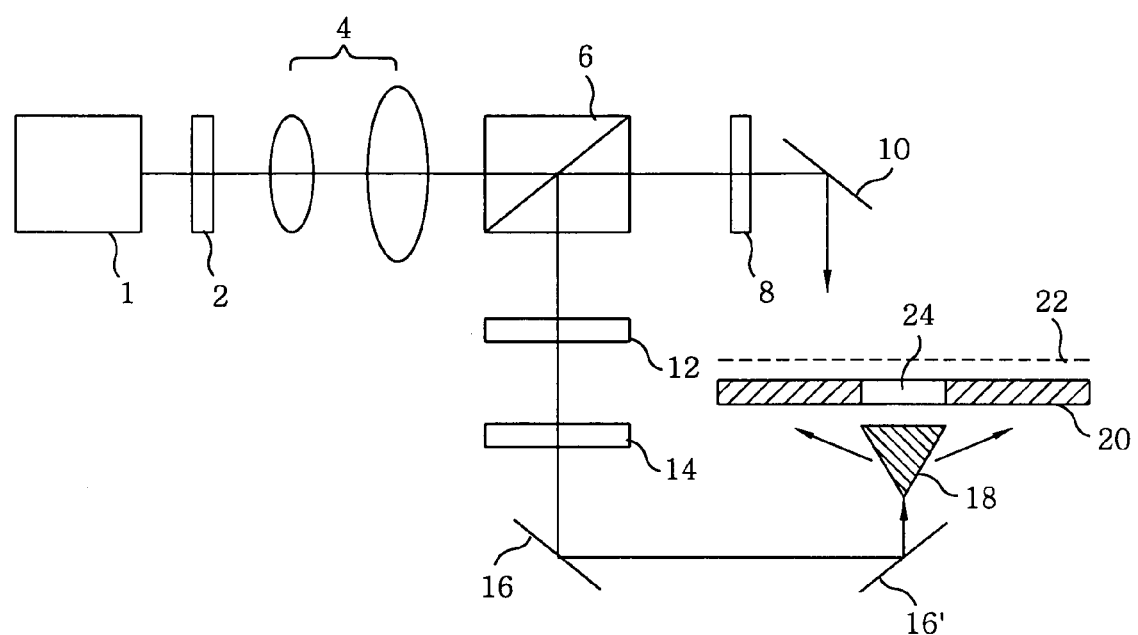
FIG. 5 sets forth a schematic view of a holographic ROM system.

FIG. 1 shows a schematic diagram of an alignment apparatus for aligning a holographic medium for storing data and a mask with patterns of the data, for use in a holographic ROM system, in accordance with the preferred embodiment of the present invention. The basic constitutions of the holographic ROM system are substantially identical to those described in the Background of the Invention with reference to FIG. 5; therefore, detailed descriptions thereof will be omitted.

The alignment apparatus includes a light source 102, a focusing lens 104, an optical fiber 106, an alignment mechanism 108, a photodetector 110 and a control unit 112. Reference numeral 108a is a disk-shaped holographic medium (hereinafter, also referred to as "disk") with an alignment mark 108a1, and reference numeral 108b is a mask with an alignment mark 108b1. The mask 108b has, e.g., slit patterns corresponding to data to be stored in the holographic medium or disk 108a. In a recording process of the holographic ROM system, a signal beam is projected onto the disk 108a via the mask 108b while a reference beam is incident onto the disk 108a from the opposite side to record holograms in the reflection geometry so that an interference pattern is recorded in the disk 108a.

Referring to FIG. 1, the light source 102 emits a beam that is used to align the disk 108a and the mask 108b, and the beam is focused through the focusing lens 104 onto the optical fiber 106. The optical fiber 106 is coupled to, e.g., a center opening serving as the alignment mark 108a1 of the disk 106.

The beam transferred by the optical fiber 106 passes through the respective alignment marks 108a1, 108b1 of the disk 108a and the mask 108b, which are held in parallel and spaced from each other by the alignment mechanism 108, to be detected by the photodetector 110.

Figure 2:
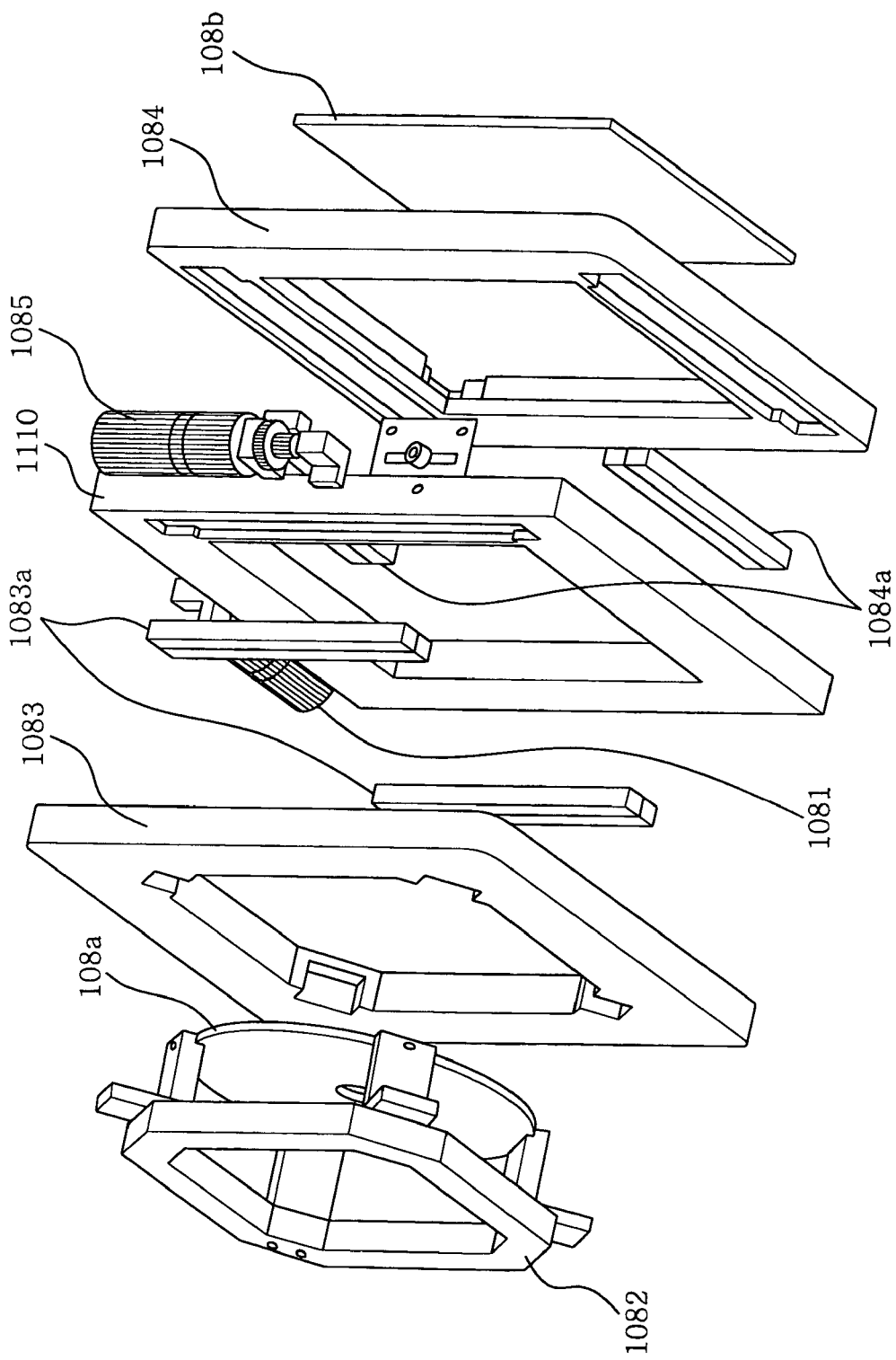
FIG. 2 describes an exploded view of an alignment mechanism of the alignment apparatus.

The alignment mechanism 108 in accordance with the preferred embodiment of the present invention will now be described with reference to FIG. 2. The disk 108a is mounted on a disk support 1083 via a disk damper 1082 and the mask 108b is mounted on a mask support 1084. A stationary plate 1110 is interposed between the disk support 1083 and the mask support 1084. The mask support 1084 is movably coupled to one side of the stationary plate 1110 through a pair of X-directional guides 1084a and can be moved along the X-directional guides 1084a by an X-drive unit (e.g., actuator) 1081 within a predetermined range (X-directional beam scan range). The disk support 1083 is movably coupled to the other side of the stationary plate 1110 through a pair of Y-directional guides 1083a and can be moved along the Y-directional guides 1083a by a Y-drive unit (e.g., actuator) 1085 within a predetermined range (Y-directional beam scan range). At this time, X-directional movement and Y-directional movement can be made simultaneously or sequentially.

Figure 3:
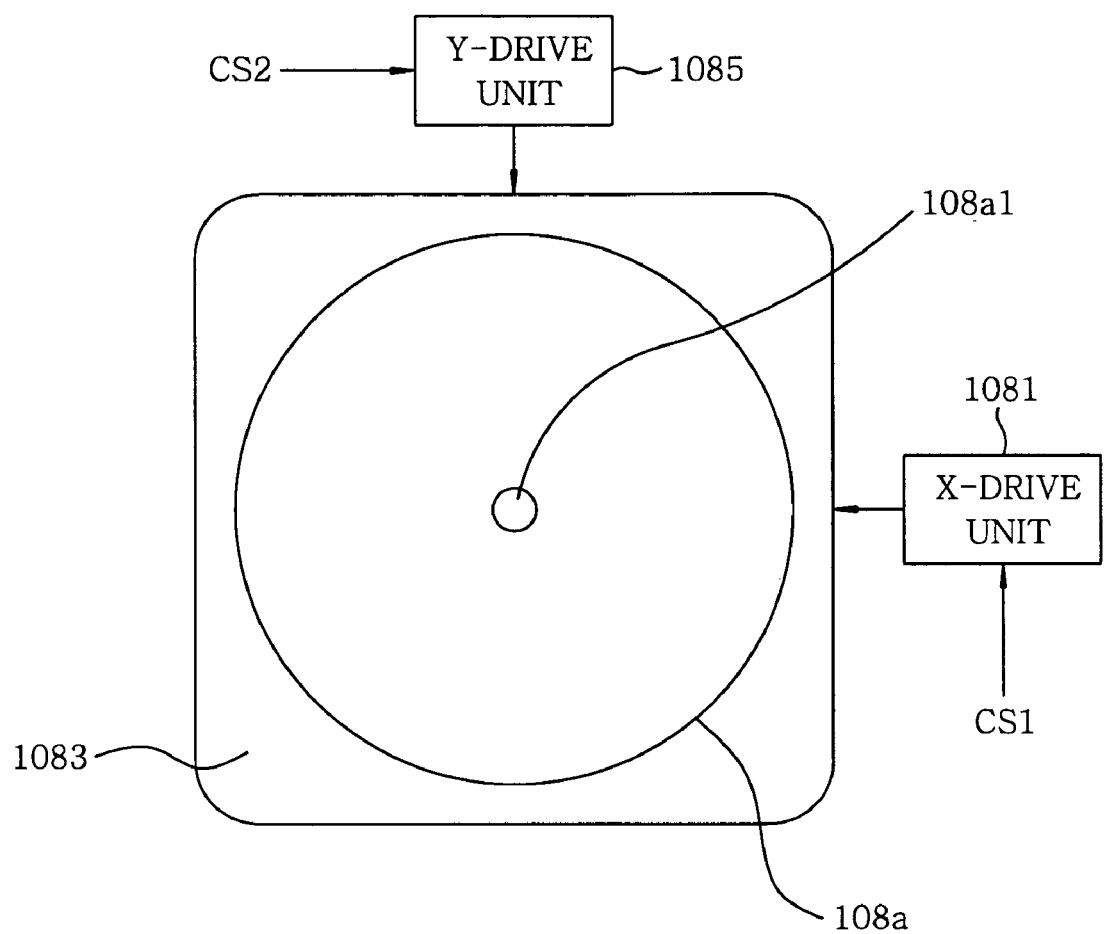
FIG. 3 represents an explanatory view for explaining an operation of the alignment apparatus.

Referring now to FIG. 3, the Y-drive unit 1085 drives the disk support 1083 in the Y direction in response to a control signal CS2 from the control unit 112, and the X-drive unit 1081 drives the mask support 1084 (not shown in FIG. 3) in the X direction in response to a control signal CS1 from the control unit 112. Specifically, while the light beam is irradiated onto the alignment mark 108b1 of the mask 108b through the optical fiber 106 coupled to the center opening or the alignment mark 108a1 of the disk 108a, the mask support 1084 is moved by the X-drive unit 1081 within the X-directional beam scan range and the disk support 1083 is moved by the Y-drive unit 1085 within the Y-directional beam scan range.

In this embodiment, the Y and X directional beam scan ranges of the disk 108a and the mask 108b which are respectively moved in the Y and X directions together with the disk support 1083 and the mask support 1084 are each about 1 mm. The beam scan ranges may be properly selected as desired.

Meanwhile, the photodetector 110 detects the beam passing through the alignment marks 108a1, 108b1 when the mask 108b and the disk 108a are respectively moved in X and Y directions in response to the driving control signals CS1, CS2 from the control unit 112, and the control unit 112 monitors the intensity of the beam detected by the photodetector 110 and stops the disk 108a and the mask 108b at a position where the greatest intensity of the beam is observed. The greatest intensity of the beam means that the alignment marks 108a1, 108b1 are most precisely aligned with each other. Although one alignment mark 108b1 is provided on the mask 108b in this embodiment, two or more alignment marks 108b1 may be provided thereon. In case two or more alignment marks 108b1 are provided and two or more optical fibers are provided correspondingly, the sum of the intensity of the beam passing through each of the alignment marks 108b1 will be increased compared with the case of one alignment mark.

Figure 4A:
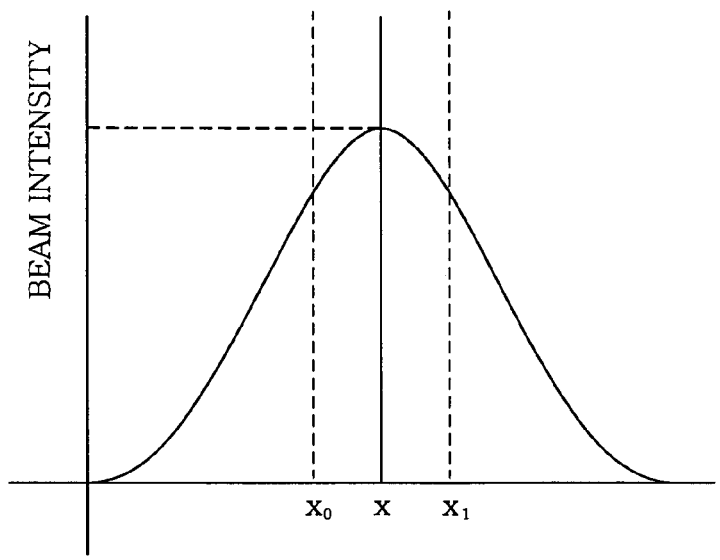
FIG. 4A is a graph showing intensity of a beam detected by a photodetector while a mask support is moved in the X-direction.

Further, the control unit 112 controls the X-drive unit 1081 to move the mask support 1084 in the X direction within the X-directional beam scan region in response to an operational signal of a user (an automatic alignment operation signal for the disk and the mask) and stop the mask support 1084 at a position where the greatest intensity of the beam is observed. For example, as shown in FIG. 4A, considering the X-directional beam scan region as x0–x1, the mask support 1084 is stopped at the position x where the greatest beam intensity is detected.

Figure 4B:
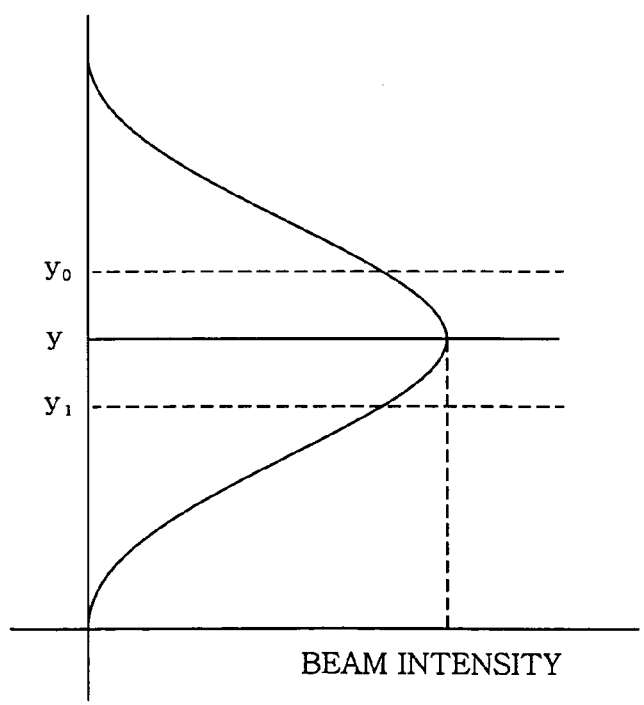
FIG. 4B is a graph showing intensity of a beam detected by the photodetector while a disk support is moved in the Y-direction.

Then, the control unit 112 controls the Y-drive unit 1085 to move the disk support 1083 in the Y direction within the Y-directional beam scan region and stop the disk support 1083 at a position where the greatest intensity of the beam is detected. For example, as shown in FIG. 4B, considering the Y-directional beam scan region as y0–y1, the disk support 1083 is stopped at the position y where the greatest beam intensity is detected.

As described above, in this embodiment, the control unit 112 sequentially controls the mask support 1084 and the disk support 1083 to move the mask 108b and the disk 108a, respectively. However, the control unit 112 may control first the disk support 1083 to move the disk 108a, and then the mask support 1084 to move the mask 108b. Alternatively, the control unit 112 may simultaneously control the mask support 1084 and the disk support 1083 to move the mask 108b and the disk 108a, respectively. In addition, although the disk 108a and the mask 108b are moved in this embodiment, only one of them may be moved for the alignment thereof. In this case, the control unit 112 may controls the mask support 1084 or the disk support 1083 to move.

Moreover, a monitor (not shown) may be provided to display the intensity of the beam detected by the photodetector 110 so that a user can manipulate the X-drive unit and Y-drive unit while directly observing the intensity of the beam passing through the alignment marks of the disk and the mask.

In accordance with the present invention, an automatic and precise alignment of the disk and the mask can be achieved without a microscope and an illumination device used in the conventional alignment process, thereby increasing the productivity of the holographic ROM system and preventing misalignment between the mask and the disk.

While the invention has been shown and described with respect to the preferred embodiments, it will be understood by those skilled in the art that various changes and modifications may be made without departing from the spirit and the scope of the invention as defined in the following claims.

What is claimed is:

1. A holographic ROM system comprising:
an alignment apparatus for aligning a holographic medium for storing data and a mask with patterns of the data, the alignment apparatus including:
a beam irradiating unit for irradiating a light beam to alignment marks of the holographic medium and the mask;
an alignment mechanism for moving at least one of the holographic medium and the mask in response to a control signal;
a photo detecting unit for detecting the beam passing through the alignment marks of the holographic medium and the mask while the holographic medium and/or the mask being moved; and
a control unit for generating the control signal, the control unit controlling the alignment mechanism based on intensity of the beam detected by the photo detecting unit.

2. The holographic ROM system of claim 1, wherein the beam irradiating unit includes a light source for generating the light beam; a collector for collecting the light beam; and a beam directing unit for directing the collected beam to the alignment marks.

3. The holographic ROM system of claim 2, wherein the beam directing unit is an optical fiber.

4. The holographic ROM system of claim 1, wherein the alignment mechanism includes a first support for supporting the holographic medium, the first support being movable in a first direction; a second support for supporting the mask, the second support being movable in a second direction perpendicular to the first direction; and a first and a second driving unit for moving the first and the second support, respectively, in response to the control signal.

5. The holographic ROM system of claim 1, wherein the alignment apparatus further include a monitor for displaying the intensity of the beam detected by the photo detecting unit.

6. A method for aligning a holographic medium for storing data and a mask with patterns of the data in a holographic ROM system, the method comprising the steps of:
irradiating a light beam to alignment marks of the holographic medium and the mask while moving the holographic medium and the mask;
detecting intensity of the beam passing through the alignment marks of the holographic medium and the mask; and
locating the holographic medium and the mask based on the intensity of the beam detected.

7. The method of claim 6, wherein the light beam is irradiated through an optical fiber, to thereby pass through the alignment marks of the holographic medium and the mask.

* * * * *